United States Patent [19]

Furukawa et al.

[11] 4,183,090
[45] Jan. 8, 1980

[54] MAGNETIC BUBBLE MEMORY EQUIPMENT

[75] Inventors: Kazuo Furukawa; Takeshi Masuda, both of Yokohama; Masakatu Nunotani, Tokyo; Norio Amano, Higashiyamato, all of Japan

[73] Assignee: Hitachi, Ltd., Japan

[21] Appl. No.: 897,392

[22] Filed: Apr. 18, 1978

[30] Foreign Application Priority Data

Apr. 20, 1977 [JP] Japan ................................. 52-44444

[51] Int. Cl.$^2$ ....................... G06C 13/00; G11C 19/08
[52] U.S. Cl. ......................................... 364/900; 365/15
[58] Field of Search ............... 364/200 MS File, 900, 364/200; 365/15

[56] References Cited

U.S. PATENT DOCUMENTS

| | | | |
|---|---|---|---|
| 3,737,881 | 6/1973 | Cordi | 364/900 |
| 3,883,849 | 5/1975 | Kita | 364/900 |
| 3,967,263 | 6/1976 | Chang | 364/900 |
| 3,971,005 | 7/1976 | Buhrer | 365/15 |
| 3,986,016 | 10/1976 | Linn | 364/200 |
| 4,064,556 | 12/1977 | Edelberg | 364/900 |

Primary Examiner—Gareth D. Shaw
Assistant Examiner—David Y. Eng
Attorney, Agent, or Firm—Craig and Antonelli

[57] ABSTRACT

A magnetic bubble memory equipment includes means for receiving address information for a plurality of access requests as a whole, and means for executing address matching operations in parallel for a plurality of addresses. Read-out or write-in command information is fetched for each of the access requests in the sequential order as the coincidence is found in the matching of address and data transfer is sequentially executed in accordance with the command information, thereby to reduce the effective access time for the plurality of the access requests.

8 Claims, 18 Drawing Figures

FIG. I
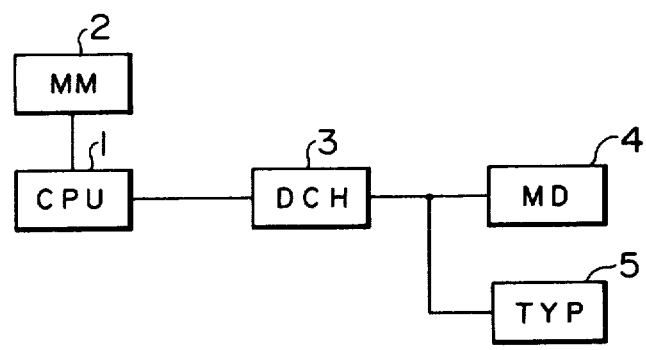
FIG. 2
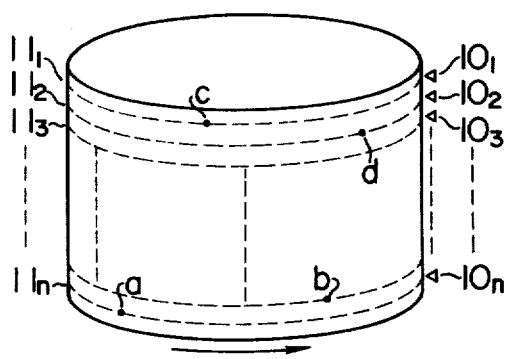
FIG. 3
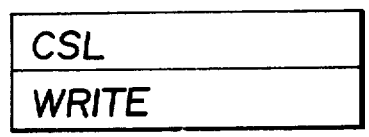

| CSL   |   |
|-------|---|
| WRITE | A |
| CSL   |   |
| READ  | B |
| CSL   |   |
| WRITE | C |
| CSL   |   |
| READ  | D |

| CSL   |   |
|-------|---|
| READ  | D |
| CSL   |   |
| READ  | C |
| CSL   |   |
| WRITE | B |
| CSL   |   |
| WRITE | A |

BUBBLE CHIP MODULE 31

MAGNETIC BUBBLE MEMORY EQUIPMENT

LIST OF THE PRIOR ART REFERENCES (37 CFR 1.56(a))

The following reference is cited to show the state of the art:

AFIPS CONFERENCE PROCEEDINGS (1975 NATIONA COMPUTER CONFERENCE) May 19-22, 1975, AFIPS Press pp. 523-528 (J. E. Ypma)

BACKGROUND OF THE INVENTION

1. Field of the Invention

The present invention relates to a magnetic bubble memory equipment which allows a plurality of access requests to be made with access time required therefor being significantly reduced.

2. Description of the Prior Art

In data processing systems equiped with a rotation type auxiliary memory or storage device (such as magnetic drum, magnetic disk or the like), effort has been made to reduce the time required for making access to the auxiliary memory device by adopting a control method compatible with features or specifications of the access device as used in the auxiliary memory device. For example, in the case of an electronic exchange system in which a magnetic drum device is employed for the auxiliary memory device, a plurality of the access requests to the magnetic drum generated sequentially in accordance with a call processing program are adapted to be processed during a single revolution of the magnetic drum by re-arranging the sequence of the access requests in view of the rotating direction of the drum with the aid of a drum control program instead of processing the access requests on the one-by-one basis in accordance with the order in which the access requests are produced, with a view to reducing the effective access time.

In order to have a better understanding of the invention, description will be first made to conventional access systems by referring to FIGS. 1 to 5.

Referring to FIG. 1 which is a schematic block diagram showing a general arrangement of a data processing system incorporating a magnetic storage drum, reference numeral 1 denotes a central processor unit (CPU) which constitutes the heart of the system for executing a program which is stored in a main memory equipment (MM) 2 together with data to be processed. Data transfer between the central processor unit or CPU1 and peripheral input/output units such as a magnetic drum equipment (MD) 4 serving as an auxiliary memory device and a typewriter (TYP) 5 serving as a man-machine communication interface is effected through a data channel equipment (DCH) 3.

Next, referring to FIG. 2 which illustrates an operation principle of a magnetic drum equipment, data are stored in the magnetic peripheral surface of the storage drum which is assumed to be rotated in the direction indicated by an arrow. Data are read out from or written in to the magnetic surface layer of the drum through magnetic heads $10_1$ to $10_n$ at circumferential tracks $11_1$ to $11_n$ each of which is assigned with an address referred to as the track address. On the other hand, each track consists of a plurality of memory locations each for storing a predetermined number of bits. The memory locations are also allotted with respective location addresses.

It is now assumed that an access request for writing-in to the magnetic drum equipment 4 takes place in the course of execution of a call processing program in the central processor unit 1. In such case, the central processor unit 1 provides two commands such as shown in FIG. 3 in the main memory equipment 2 under the control of a magnetic drum control program. The instruction to the magnetic drum equipment 4 for commanding a sequence of write-in or read-out operations is usually constituted by two commands, i.e. a first command CSL (Control Search Location Command) for initiating the search and matching of address of memory location in the magnetic drum memory at which data to be transferred are stored or read out and a second command WRITE or READ for designating the write-in or read-out operation. In accordance with the magnetic drum control program, the central processor unit 1 executes input/output start instruction and gives a command to the data channel equipment 3 to initiate the transfer of the above set of commands. In response thereto, the data channel equipment 3 transfers at first the first command CSL. More specifically, track address and location address commands are transmitted to the magnetic drum memory 4, which then initiates address matching as to whether the commanded addresses are accessible at that moment and simultaneously signals to the data channel equipment 3 the completed reception of the address commands. The data channel equipment 3 will then send out the succeeding command (write-in command WRITE in the case of the described example) to the magnetic drum memory 4 for preparation of executing the write-in (or read-out) operation. After the completion of the address matching, the write-in operation is performed at the magnetic drum memory equipment 4 in accordance with the write-in command WRITE. It is command in practice that the magnetic drum control program is so set up that the magnetic drum memory 4 is accessed periodically, whereby a plurality of access requests generated during a single period are sequentially processed under commands of the single input/output start instruction. For example, it is assumed that the access requests A, B, C and D have been generated during a single period in this order. In such case, a command set shown in FIG. 4 will be prepared for the main memory equipment. When the memory locations on the rotating magnetic drum as designated by the address commands corresponding to the acess requests A, B, C and D are positioned in the order of d, b, c and a as shown in FIG. 2, respectively, then the access request A will be processed during the first rotation of the magnetic drum, while the access requests B and C are processed during the second rotation with the access request D processed finally during the third rotation of the magnetic drum, on the assumption that the access requests A, B, C and D are processed in the order as they are generated. As the result, the time required for processing the four access requests in response to the single input/output start command will amount to the time duration greater than that required for twice rotations of the magnetic drum and smaller than that required for three rotations of the drum. In order to reduce the time required for such processing, the magnetic drum control is so programmed that the commands for the access requests are re-arranged in respect of the requestiall order thereof in such a manner that the heads associated with the access requests may reach the respective addressed memory locations sequentially during a single rotation of the magnetic drum, as is well known in the art. For example, in the case of the above assumed example, the access requests A, B, C and D are re-arranged in the order of D, B, C and A and processed during the single rotation of the magnetic drum under the command of the input/output start instruction. In this manner, a plurality of access requests (four requests in the illustrated example) can be executed during a single rotation of the magnetic drum.

Lately, magnetic bubble memory equipments which operates by making use of lately discovered magnetic phenomenon for storage of binary information or data have been developed and attract attention as a novel memory device which can be employed in place of the conventional magnetic drum equipments, magnetic disk equipments or the like.

The magnetic bubble memory device may be regarded as a variety of rotation type auxiliary memory equipment in the same sense as the magnetic drum equipment in respect of the accessing system. However, the magnetic bubble memory equipment differs from the magnetic drum memory with regard to the address assignment although the magnetic bubble memory is also provided with sequential addresses, as will be described below by referring to FIGS. 6 to 8.

In general, the magnetic bubble memory equipment is composed of a plurality of bubble chips, in each of which an arrangement of a major loop and minor loops is provided. As is known, the major and minor loop arrangement can be represented as shown in FIG. 6 and allotted with addressed as indicated therein. More particularly, each of the minor loops 12-0 to 12-$\beta$ is assigned with minor loop addresses $P_o$ to $P_\alpha$ at the same bit positions in common to all the minor loops. The major loop 13 is in contact with all the minor loops at gate positions 14 through which single bits at the identical minor loop addresses ($P_o$ to $P_\alpha$) can be shifted to the major loop 13 at the same time. The data bits in number of $\beta+1$ gated to the major loop 13 are assigned with major loop addresses $Q_o$ to $Q_\beta$ sequentially starting from the leading bit (the lowermost bit as viewed in FIG. 6). The suffix numbers attached to the major loop addresses of the shifted bits correspond to the suffix number of the minor loops in which the corresponding bits have been stored. Additionally, the bubble chips are also allotted with respective chip addresses. In the case of the bubble chip shown in FIG. 6, it will be seen that the chip address No. 0 is allotted. Through these three kinds of addresses, i.e. the minor loop addresses, major loop addresses and the chip addresses, any bit location in a given chip can be designated. For example, the bit location at a point d in FIG. 6 can be designated by a combination of the minor address $P_1$, major address $Q_{\beta-1}$ and the chip address No. 0. Reference numeral 15 denotes a sensor which serves for write-in and read-out operations and is usually composed of separate parts destined for write-in and read-out operation, respectively. These sensor parts may be located at different positions on the major loop 13, although the sensor 15 is illustrated as an integral unit located at the same position for the convenience of description. Arrows 16 indicate the direction in which the stored data bits are moved or shifted in the minor and major loops.

For the description of access operation to the magnetic bubble memory, reference is again made to FIG. 6 on the assumption that the data bit stored at the location d is to be read out by way of example. Under the influence of a rotating magnetic field is applied to the whole bubble chip No. 0, the data bit stored at the location d is caused to be shifted along the minor loop 12-$\beta_{-1}$ in the direction indictated by the arrow 16 and reaches the gate position 14 which is then activated to gate the data bit to the major loop 13. At the same time, all the data bits stored in the other minor loops at the identical addresses $P_1$ are also transferred to the major loop 13. The magnetic bubbles in a train thus transferred to the major loop 13 inclusive of the bubble d are allotted with respective addresses $Q_o$ to $Q_\beta$ and caused to move along the major loop 13 in the direction incicated by the arrow 16 under the influence of the correspondingly rotating magnetic field thereby to pass by the sensor 15 sequentially. When the memory data bubble d now allotted with the major loop address $Q_{\beta-1}$ has reached the sensor 15, the memory data located originally at d is read out. The write-in of data bit to the bubble or memory location d is effected in a similar manner. Namely, when the magnetic bubble d passes by the sensor 15, the write-in operation is performed. After the completed read-out or write-in operation to the magnetic bubble d, the latter is caused to further move along the major loop 13 in the direction 16 to the gate position 14 associated with the minor loop 12-$\beta_{-1}$. At that time, all the bits originally stored in the other minor loops at the same minor loop addresses $P_1$ attain the respective gate positions 14, since the number of bits in each of the minor loops is usually selected equal to that of the major loop 13. Thus, all the magnetic bubbles inclusive of the bubble or bit d allotted with the major loop addresses $Q_o$ to $Q_\beta$ are transferred to the respective minor loops through the actions of the respective gates 14 to be stored again in the minor loops at the memory locations designated by the address $P_1$. As will be appreciated from the foregoing description on the typical accessing operations to the bubble chip of the major and minor loop arrangement, the location of a bit stored in a minor loop to be read out is designated by the minor address assigned thereto and, after having been transferred to the major loop, the bit undergoes the read-out or write-in operation through the sensor at the location in the major loop designated by the major loop address. To this end, the address information including the chip address is constituted by three address fields. The accessing operation includes the first search operation at the minor loops on the basis of the minor loop addresses and the second search operation at the major loop with the aid of the major loop addresses after the completion of the first search operation and the corresponding bit transfer. The accessing operation to the magnetic bubble memory comprising bubble chips each constituted by minor and major loop arrangement as described above is apparently different from the accessing operation to the magnetic drum apparatus.

Next, description will be made on the read-out and-/or write-in operations for a plurality of access requests by referring to FIG. 7. For the convenience of illustration, it is assumed that the magnetic bubble memory is constituted by four bubble chips No. 0, No. 1, No. 2 and No. 3, each of which includes minor and major memory loops in the arrangement such as shown in FIG. 6. Description on the restorage operation will be omitted. Further, it is to be mentioned that the illustration of the minor and major arrangements of the bubble chips in FIG. 7 is modified with a view to making clear the correspondence to the magnetic drum memory shown in FIG. 2. In FIG. 7, symbols No. 0 to No. 3 denote the magnetic bubble chips designated by corresponding addresses No. 0 to No. 3 and adapted to be rotated in the direction indicated by arrows 16 in synchronism with one another. The bubble chips No. 0 to No. 3 comprise, respectively the minor loops 20-0 to 20-3, the major loops 21-0 to 21-3, sensors 22-0 to 22-3 and gate positions 23-0 to 23-3.

Now, it is assumed that four access requests A, B, C and D are generated for the magnetic bubble memory shown in FIG. 7 and that the bit locations a, b, c and d are designated for the access requests A, B, C and D by the addressing information. As is in the case of the magnetic drum memory described hereinbefore in conjunction with FIG. 2, it is assumed that the access requests are re-arranged in the order of D, B, C and A in correspondence to the sequential order in which the memory locations a, b, c and d reach the positions of the associated sensors 22-0, 22-1, 22-2 and 22-3. In this connection, no difficulty will arise in such re-arrangement of the execution order of the access requests, since the time required for the memory locations or bubbles a, b, c and d to reach the associated sensors 22-0, 22-1, 22-2 and 22-3 can be easily determined and programmed by calculating the distances from the memory locations a, b, c and d to the associated sensors on the basis of the minor loop addresses and the major loop addresses allotted to these locations. Through the re-arrangement, the commands for the access requests A, B, C and D are in such a sequence as shown in FIG. 5.

Next, referring to a timing chart shown in FIG. 8, description will be made on the manner how the processing operations are performed for the access requests.

In the first place, the command for the access request D is executed. More specifically, the command CSL is executed and the address matching (or search operation) at the location d is conducted on the basis of the address information supplied as accompanying the command. Upon completed address matching, read-out operation is executed in accordance with the operation command, say the READ command in this case, which has been previously received, whereby the data transfer is performed for the access request D.

When the data transfer for the access request D has been completed, then the address matching at the location b is initiated in response to the reception of the command CSL for the access request B. It is assumed that the time $t_{ds}$ required for the bubble d to have been read out at the sensor 22-0 is greater than the time $t_{bm}$ required for the bubble or bit b to reach the gate position 23-2, that is $t_{ds} > t_{bm}$. In such case, the bubble b will have passed by the gate position 23-2 when the magnetic bubble memory receives the command CSL for the access request B, as shown in FIG. 8, as the result of which the bubble b has to be moved along the associated minor loop for about one revolution before the bit b can be gated to the major loop 21-2. After such standby movement, the read-out operation of the bit b is executed for the access request B and then the processing for the access request A can be executed. It will be thus appreciated that the processing of four access requests requries extra time corresponding approximately to the time for a bubble to be moved along the whole length of the minor loop, involving the lowered efficiency. In the case of the above example, the timing relation between the access requests D and B is a cause for an undesirable increase in the processing time. However, such unfavorable timing relation may equally occur between the access requests B and C as well as between the access requests C and A. In any case, when a bit designated by the address information for an access request has just passed by the associated sensor at the completion of the processing for the preceding access request, a standby time corresponding approximately to the time required for the succeeding bit to reach again the associated sensor position after about one circulation in the minor loop.

As will be apparent from the above discussion, the procedure of determining the order of the access requests to be executed in dependence on the distances between the memory locations as addressed by the access commands and the associated sensors or head so that the processing of the access requests is executed sequentially starting from the addressed bit located nearest to the associated sensor or head is not effective for reducing the access time in the case of the magnetic bubble memory device due to unique address asignment, although the procedure is certainly very effective for shortening the access time in the case of the magnetic drum memory. Thus, difficulty is encountered in the attempt for reducing the effective access time of the magnetic bubble memory device thereby to increase the processing capability or efficiency of the magnetic bubble memory.

SUMMARY OF THE INVENTION

An object of the invention is to eliminate the drawbacks of the magnetic bubble memory as describe above and to provide an improved magnetic bubble memory equipment of major and minor loop structure in which the standby time required for address matching is reduced and accessing to the memory device can be executed with a high efficiency.

In the present invention, means for executing addressing or address matching operations in parallel for a plurality of access requests instead of executing the addressing operations sequentially for each of the access requests. More specifically, addresses of memory locations in the magnetic bubble memory device for a plurality of succeeding access requests are all previously transmitted to the magnetic bubble memory equipment through a data channel equipment and stored in registers. Means are provided for executing in parallel the matching or comparison operations between the addresses information as stored and information representing the moving state of the memory information in the magnetic bubble memory, and means is provided for executing the read-out and/or write-in operations after the address matching.

In accordance with one aspect of the present invention, there is provided a magnetic bubble memory equipment adapted to receive address informations for a plurality of access requests each of which informations includes a chip address, a minor loop address and a major loop address and receive operation command informations commanding either read-out or write-in operations corresponding to said access requests from a data channel equipment and execute sequentially data transfers with the data channel equipment, comprising:

(a) a bubble chip module including a plurality of magnetic bubble memory chips each of which is of a major-minor loop configuration having gates, gate driver circuits for driving the gates of the chips in response to a gate drive signal, a gating signal connection circuit adapted to receive the chip address and the gate drive signal and apply the received gate drive signal to the gate driver circuit corresponding to the received chip address thereby to drive the associated gate, and chip selector circuit means for receiving said operation command informations, the chip address and data transfer command signal thereby to perform data read-out operation or data write-in operation for the chip corresponding to the received chip address:

(b) address information storage means for receiving a plurality of address informations for the plurality of access requests in one lot from the data channel equipment to store therein separately the chip addresses, minor loop addresses and the major loop addresses separately for each of the access requests;

(c) matching means including first signal generating means for generating signals indicating rotating positions of the minor loops of the magnetic bubble memory chips, second signal generating means for generating signals indicating rotation positions of the informations in the major loop after having been transferred from the minor loops in each of the chips corresponding to the plurality of access requests, first matching means for fetching sequentially the minor loop addresses for the plurality of access requests from the address information storage means to veryfy matching to said signals indicating the rotating positions of the minor loops thereby to output the gate drive signals upon verification of the matching, and second matching means for fetching sequentially the major loop addresses for the plurality of access requests from the address information storage means to veryfy matching to the signals indicating the rotating positions of informations in the major loops thereby to output the data transfer command signal upon verification of said matchings; and (d) means for executing the data transfers between the magnetic bubble chip module and the data channel equipment, the executing means including operation command means for receiving the operation command informations and identifying the contents thereof in respect to data read-out or write-in commands thereby to cause the chip selector circuit means to perform the read-out or write-in operation in dependence on the contents of the operation command information, means for receiving the data transfer command signals from the matching means and sending the read-out data from the chip selector circuit means to the data channel equipment or sending the data to be written from the data channel equipment to the chip selector circuit means in accordance with the command identified by the operation command means, and means for fetching the operation command information from the data channel equipment to be supplied to the operation command means and fetching the address informations to be supplied to the address information storage means.

BRIEF DESCRIPTION OF THE DRAWINGS

In the drawings:

FIG. 1 is a block diagram showing a general arrangement of a data processing system having a magnetic drum memory equipment;

FIG. 2 illustrates an operating principle of a magnetic drum memory device;

FIG. 3 illustrates a format of command for use in executing access to the magnetic drum memory device;

DESCRIPTION OF THE PREFERRED EMBODIMENTS

Now, the invention will be described in detail in conjunction with exemplary embodiments thereof shown in FIGS. 9, 10, 11, 12, 13, 14 and 15.

Figure 9:
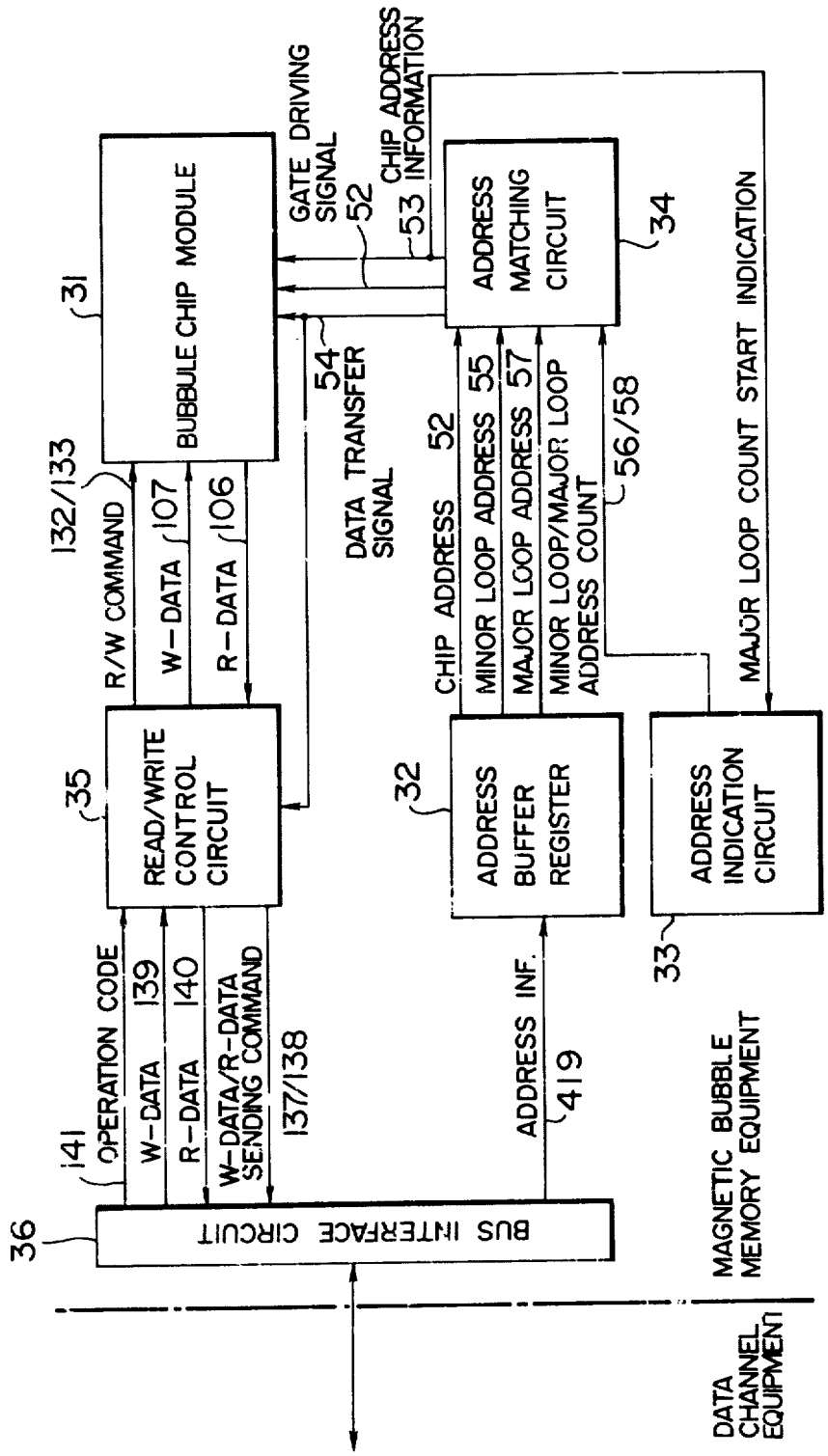
FIG. 9 is a block diagram showing a general arrangement of a magnetic bubble memory equipment according to an exemplary embodiment of the invention.

Referring to FIG. 9 which is a block diagram showing a general arrangement of a magnetic bubble memory equipment according to an embodiment of the invention, the memory equipment includes a bubble chip module 31 constituting the essential part of the magnetic bubble memory equipment, an address buffer register 32 for storing temporarily address information for the bubble chip module 31 as transmitted from a data channel equipment, an address indication circuit 33 adapted to monitor and indicate the instantaneous rotating position or state of the bubble chip module 31, an address matching or verifying circuit 34 for checking and verifying coincidence between the contents stored in the address buffer register 32 and the indication at the address indication circuit 33, and a read/write control circuit 35 adapted to be triggered by the address matching circuit 34 for controlling the write-in/read-out operations for the bubble chip module 31 under the command of the write-in/read-out instruction fed from the data channel equipment. A bus interface circuit 36 serves for selection and distribution of signals transferred between the magnetic bubble memory equipment and the data channel equipment.

Next, description will be made on the exemplary implementations of the function blocks shown in FIG. 9 on the assumption that the magnetic bubble memory equipment is capable of processing four access requests in one cycle of operation and that the bubble chip module 31 is composed of four bubble chips or four chip sub-modules.

Figure 10:
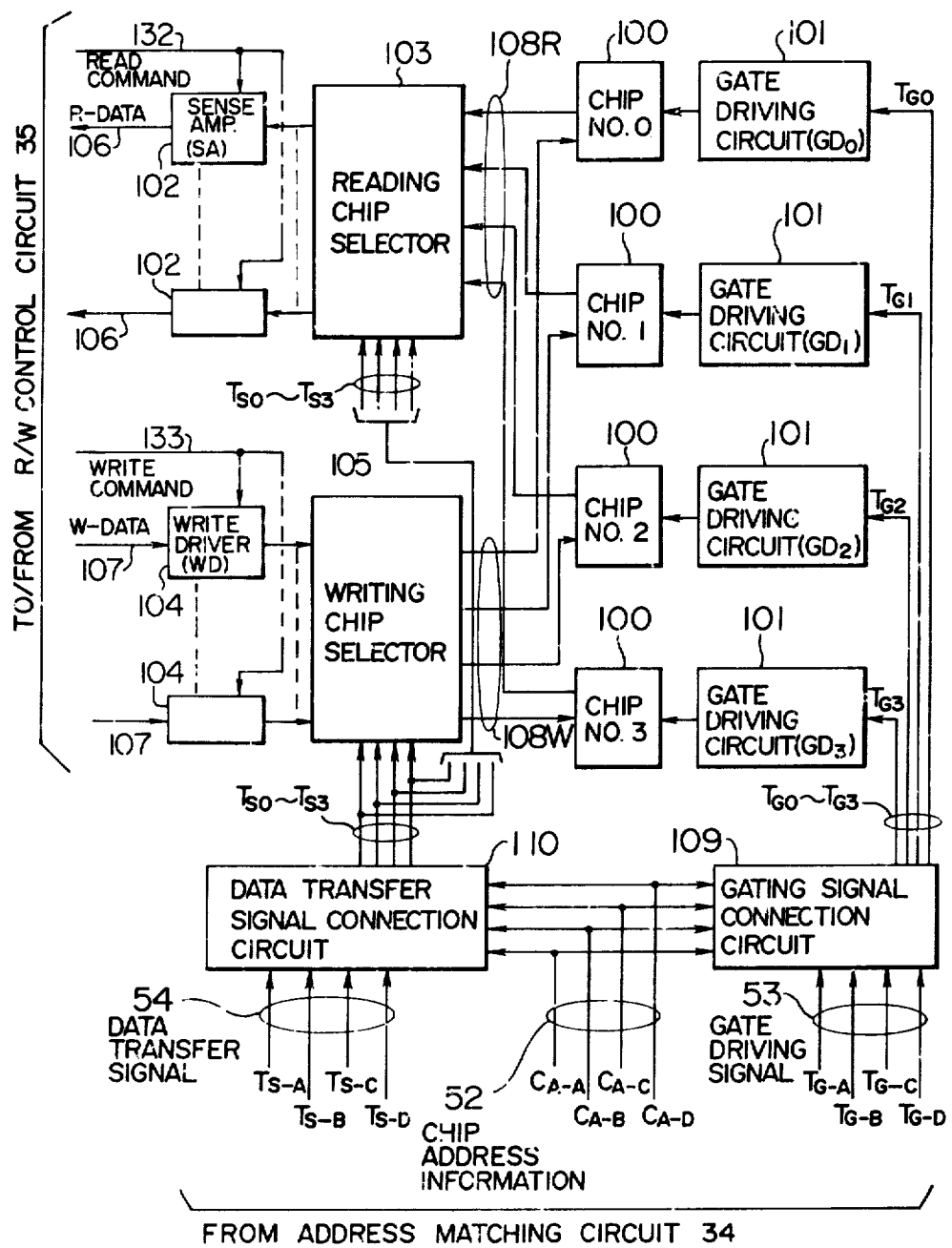
FIG. 10 is a detailed block diagram of a magnetic bubble memory module according to an embodiment of the invention.

FIG. 10 shows an exemplary embodiment of the bubble chip module 31 shown in FIG. 9, which module is assumed to be constituted by four chips 100 each allotted with the chip addresses No. 0, No. 1, No. 2 and No. 3. Gate driving circuits 101 are provided for the bubble chips 100, respectively, for controlling the gating operations of the gates implemented in the bubble chips to cause the data transfers or transits between the major loop and the minor loops of the individual chips in response to the gating signals $T_{G0}$, $T_{G1}$, $T_{G2}$ and $T_{G3}$ supplied from a gating signal connection circuit.

Figures 4, 5, 6:
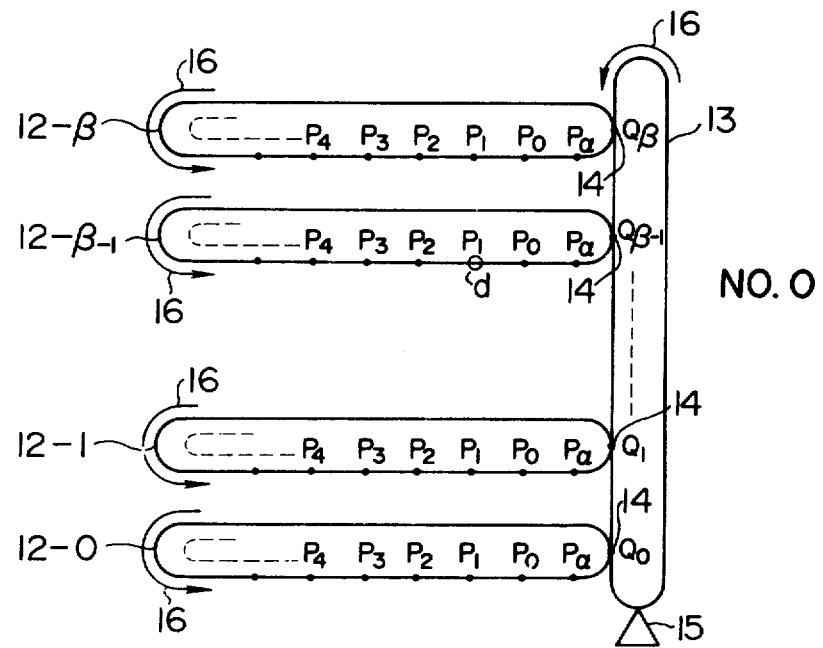
FIG. 4 illustrates a format of command sets for a plurality of access requests.
FIG. 5 shows a format in which the command sets shown in FIG. 4 are re-arranged.
FIG. 6 schematically illustrates an arrangement of a major loop and minor loops in a magnetic bubble chip used in a magnetic bubble memory.

Data 107 destined to be written in the chip module (W-Data) is converted into an electric signal for driving the write-in/read-out sensor 15 (refer to FIG. 6) provided in each of the bubble chips through write drivers (WD) 104 which are validated or enabled by a command signal WRITE applied through the line 133. The number of the write drivers is the same as that of the chips which are simultaneously subjected to the writing operation. The electric signal thus obtained is then applied to a writing chip selector circuit 105 which will then supply a sensor enabling signal through a writing signal line 108 W to the sensor 15 for desired ones of the four chips No. 0, No. 1, No. 2 and No. 3 selected in dependence on desired ones, which are validated, among data transfer command signals $T_{S0}$, $T_{S1}$, $T_{S2}$ and $T_{S3}$ available from a data transfer signal connection circuit 110, whereby the write-in operation to the selected chip is executed.

In the reading operation, those of the read-out signal wires 108R extending from the sensors of the bubble chips which correspond to the selected bubble chips are selected by a reading chip selector circuit 103 in dependence on the data transfer command signals $T_{S0}$ to $T_{S3}$ and connected to sense amplifiers 102 validated by the READ command 132, whereby the read-out data (R-data) 106 from the selected bubble chip is supplied to the read/write control circuit 35. The number of the sense amplifiers is the same as that of the chips which are simultaneously subjected to the reading operation. Reference numeral 109 denotes a gating signal connection circuit which serves to connect the gate drive signal ($T_{G-A}$ to $T_{G-D}$) 53 fed from the address matching or verifying circuit 34 to the output wires $T_{G0}$ to $T_{G3}$ for driving the gate of the designated bubble chip. A data transfer signal connection circuit 110 is provided and functions to produce a data transfer command signal ($T_{S-A}$ to $T_{S-D}$) on the output wires $T_{S0}$ to $T_{S3}$ in dependence on the chip address information ($C_{A-A}$ to $C_{A-D}$).

Figure 11:
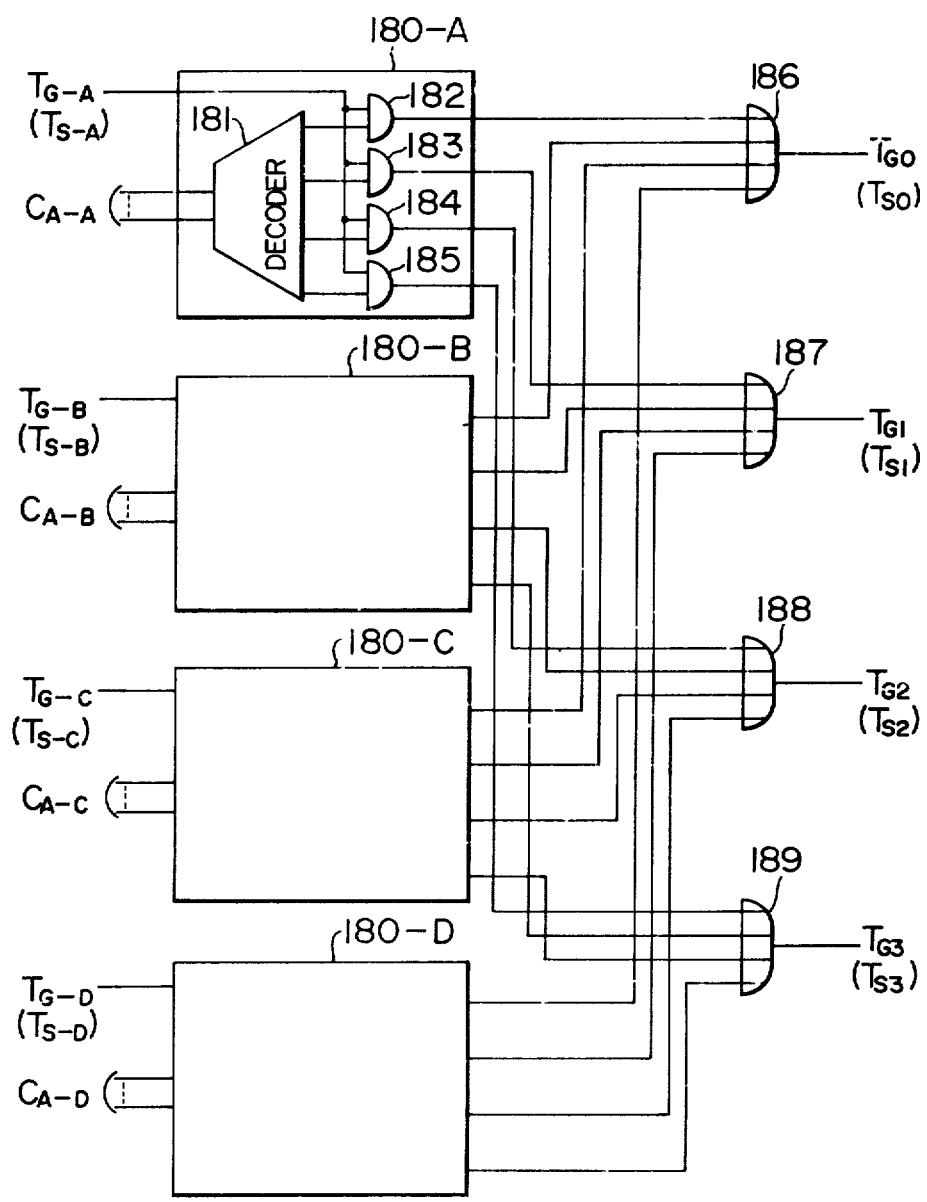
FIG. 11 is a circuit diagram of a gating signal connection circuit and a data transfer signal connection circuit shown in FIG. 10.

FIG. 11 shows an exemplary embodiment of the gating signal connection circuit 109. A connector circuit 180-A serves to connect the gate driving signal $T_{G-A}$ for the access request A to the output wires $T_{G0}-T_{G3}$ designated by chip address information $C_{A-A}$ through a gate circuit 182, 183, 184 or 185 which is validated by an output signal from a decoder 181 adapted to decode the chip address information $C_{A-A}$ including desired number of addresses corresponding to chips simultaneously subjected to reading or writing operation. Circuits 180-B, 180-C and 180-D have the same configuration and function as the circuit 180-A. The signals $T_{G0}$, $T_{G1}$, $T_{G2}$ and $T_{G3}$ described above are derived from the outputs of OR-gates 186, 187, 188 and 189. The data transfer command signal connection circuit 110 may be realized in a similar circuit arrangement as the gating signal connection circuit 109.

Figure 12:
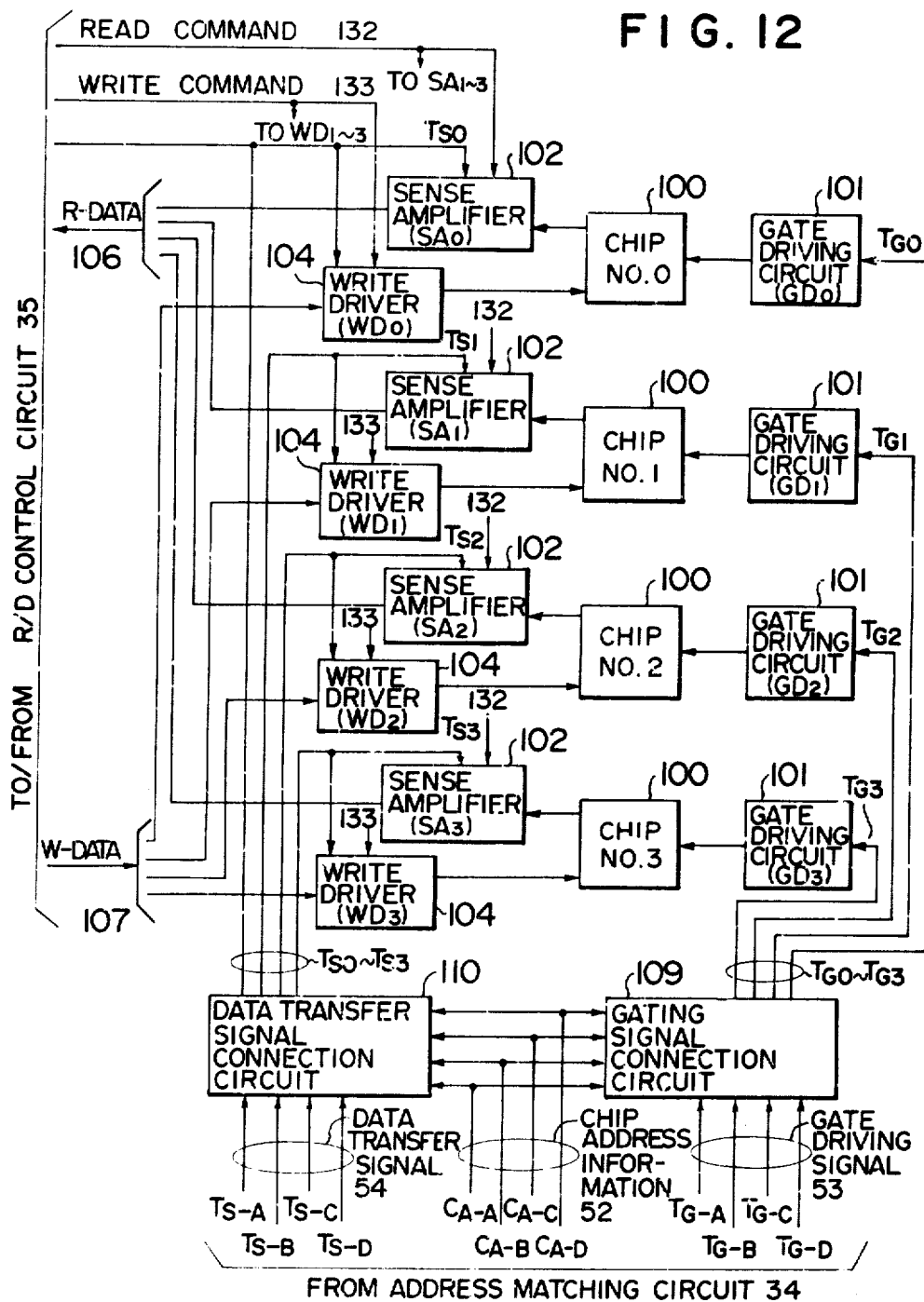
FIG. 12 is a block diagram showing another magnetic bubble memory module according to the invention.

FIG. 12 shows another embodiment of the magnetic bubble memory which incorporates a bubble chip module constituted by four chips as in the case of the memory equipment shown in FIG. 10 and differs from the latter in respect to the means for selecting the chip in the read-out/write-in operations. More specifically, sense amplifiers 102 ($SA_0$, $SA_1$, $SA_2$ and $SA_3$) as well as writing drivers 104 ($WD_0$, $WD_1$, $WD_2$ and $WD_3$) are connected to the sensors 15 (FIG. 6) of the bubble chips No. 0, No. 1, No. 2 and No. 3, respectively. The operation of the sense amplifiers 102 and the writing driver circuits 104 are controlled by the data transfer command signals $T_{S0}$ to $T_{S3}$ for selecting desired ones of four chips, whereby the data transfer is effected between the selected chip and the read/write control circuit 35. It is assumed now that the read-out operation is to be executed from the chip No. 1. At the time point when bubble information reaches the sensor 15 of the chip No. 1, the data transfer command signal $T_{S1}$ is validated to enable the sense amplifier $SA_1$ thereby to output the read-out data as R-Data. The other sense amplifiers $SA_0$, $SA_2$ and $SA_3$ remain inoperative, when the respective data transfer command signals $T_{S0}$, $T_{S2}$ and $T_{S3}$ are not validated because of the chips No. 0, No. 2 and No. 3 being not selected. Thus, only the output from the selected sense amplifier $SA_1$ will constitute the output of the R-Data 106. The data write-in operation of the data (W-Data) 107 is executed in a similar manner by selecting the chip to which the data write-in operation is to be made.

Figure 13:
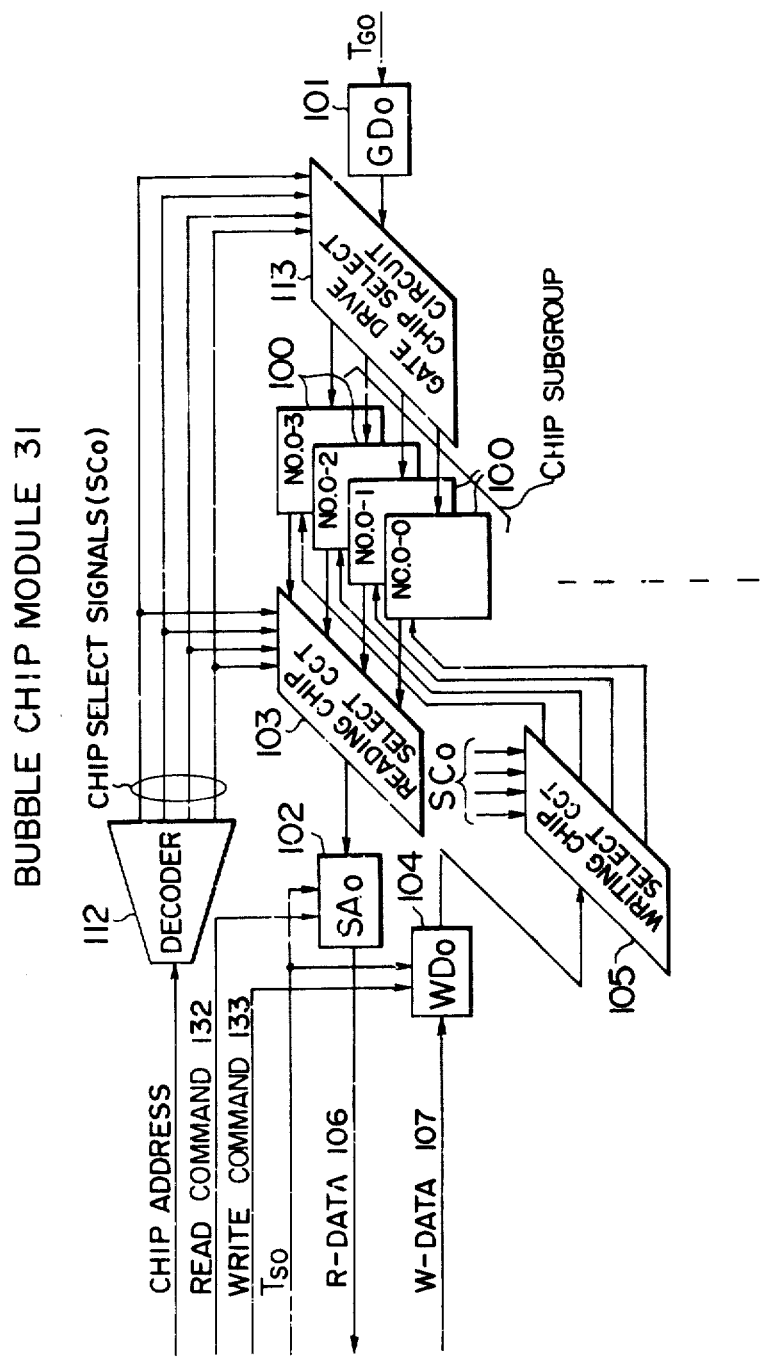
FIG. 13 is a fragmental block diagram showing a portion of a magnetic bubble memory of a greater capacity than those shown in FIGS. 10 and 12.

FIG. 13 shows another embodiment of the magnetic bubble memory which differs from the equipment shown in FIG. 12 in that the bubble chip module 31 is composed of four chips No. 0, No. 1, No. 2 and No. 3 each of which in turn is constituted by a subgroup of four chip segments. For the simplification of illustration, only the circuitry corresponding to that of the chip No. 0 of FIG. 2 is shown in the drawing. It will be appreciated that other circuitries for the chips No. 1, No. 2 and No. 3 are of the same configuration. The chip segments No. 0-0, No. 0-1, No. 0-2 and No. 0-3 are addressed by the chip address and selection thereof is made by a segment address $CA_o$ which constitutes a part of the chip address. More specifically, the segment address $CA_o$ is discomposed into four chip segment select signals ($S_{CO}$) through a decoder 112, wherein a reading chip segment selector circuit 103, a writing chip segment selector circuit 105 and a chip selector 113 for gate drivers are validated in dependence on the decoded outputs from the decoder 112 thereby to connect the selected chip segment as designated by the segment address $CA_o$ of the chip address to the lines ($SA_o$) 102, ($WD_o$) 104 and ($GD_o$) 101. In this manner, desired write-in operation can be executed.

Figure 14:
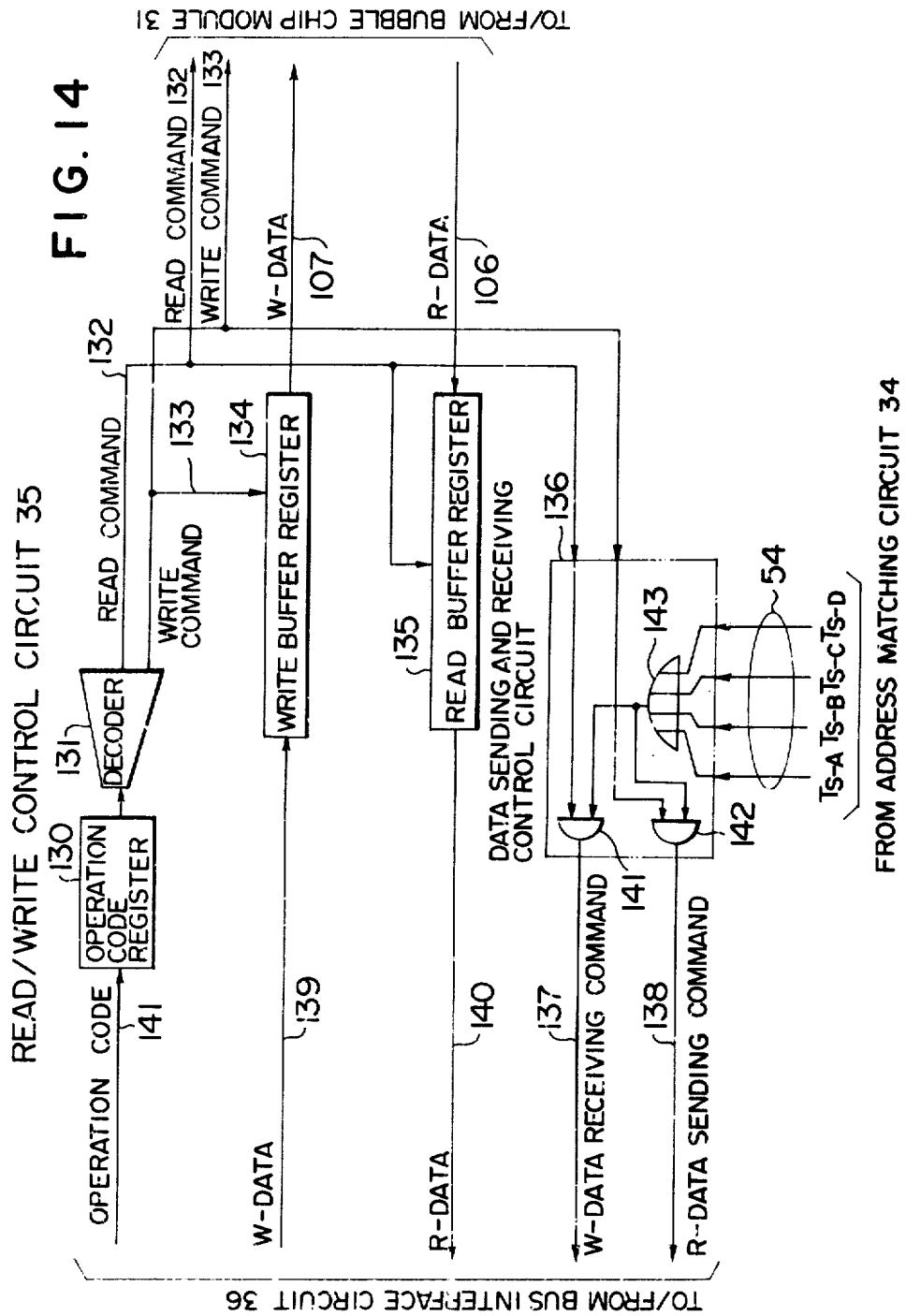
FIG. 14 is a block diagram showing in detail an arrangement of a read-out and write-in control circuit.

FIG. 14 shows an exemplary arrangement of the read/write control circuit 35. An operation code register 130 stores therein information representative of the variety of the data transfer operation to be executed (READ or WRITE command in the case of the illustrated embodiment). This information is decoded by a decoder 131, as a result of which either the signal line 132 for the READ command or the signal line 133 for the WRITE command is energized thereby designate the read-out or write-in operation to be executed. When the information to which access is to be made has reached the sensor 15 on a certain chip, the validated data transfer command signal (one of the signals $T_{S-A}$ to $T_{S-D}$ is fed from the address matching circuit 34 and applied to a data sending/receiving control circuit 136. When the READ command 132 is validated, an R-Data sending command 138 is transmitted to the bus interface 36. On the other hand, when the WRITE command 133 is validated, a W-Data receiving command 137 is suppleid to the bus interface 36. In accordance with these two types of commands, the bus interface 36 performs data transfer with the data channel equipment. In the case where the R-Data sending command 138 is sent, the R-data 106 from the bubble chip module 31 is transferred to the bus interface 36 as R-Data 140 through a read buffer memory 135 which has been enabled or validated by the READ command 132. The data signal R-Data 140 is hence transferred to the data channel equipment. When the W-Data receiving command 137 is sent, the data to be written as received from the data channel equipment is inputted to a write buffer register 134 as data signal W-Data 139. Since the write buffer register 134 is in the operative state as enabled by the WRITE command 133, the input data thereto passe therethrough to be transferred to the bubble chip module 31 as the data W-Data 107. The data sending/receiving control circuit 136 may be composed of AND-gates 141 and 142 and an OR-gate 143. The number of the write buffer registers 134 as well as the number of the read buffer register 135 is the same as that of bubble chips simultaneously subjected to the writing or reading operation. The data transfer command signal ($T_{S-A}$, $T_{S-B}$, $T_{S-C}$, $T_{S-D}$) is applied to the inputs of the OR-gate 143, the output from which is applied to one input of each of the AND gates 141 and 142. The other inputs of the AND-gates are applied with the READ command 132 and the WRITE command 133, respectively. The output from the AND-gate 141 will then be a receiving command (W-data) 137 to the bus interface 36, while the output from the AND-gate 142 will be a sending command (R-data) 138.

Figure 15:
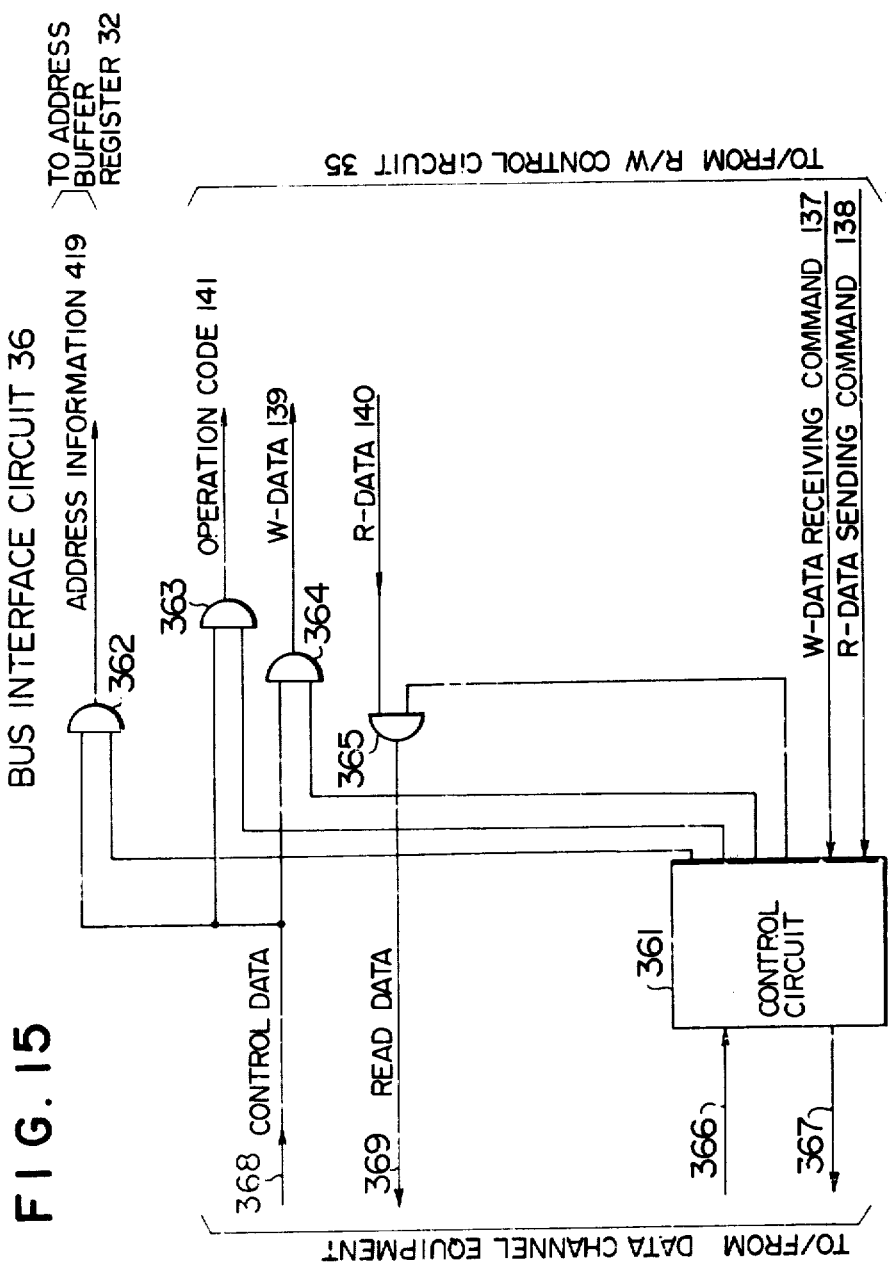
FIG. 15 is a block diagram showing in detail an arrangement of a bus interface.

FIG. 15 shows an exemplary arrangement of the bus interface circuit 36. When a control circuit 361 is triggered from the data channel equipment through a control line 366, the control circuit 361 enables the AND-gate 362 to gate the address information 419 from the control data 368 to the address buffer register 32. Then, the control circuit 361 interrogates the data channel equipment through a control line 361 to enable an AND-gate 364 to gate an operation code from the control data 368 therethrough to an operation code register 130. Next, the control circuit 361 receives the W-Data receiving command 137 (or alternatively R-Data sending command 138) from the read/write control circuit 35 and interrogates the data channel equipment through a control line 367 to enable an AND gate 364 to gate therethrough the W-data information 139 from the control data 368 to the read/write control circuit 35 (or alternatively to enable the AND-gate 365 to gate therethrough R-Data 140 from the read/write control circuit 35 to the data channel equipment in a form of a read data 369). After the completion of the first data transfer, the control circuit 361 will then interrogate the data channel equipment to enable again the AND-gate 363 to gate therethrough the succeeding operation code from the control data 368. The same procedure is repeated.

Figure 16:
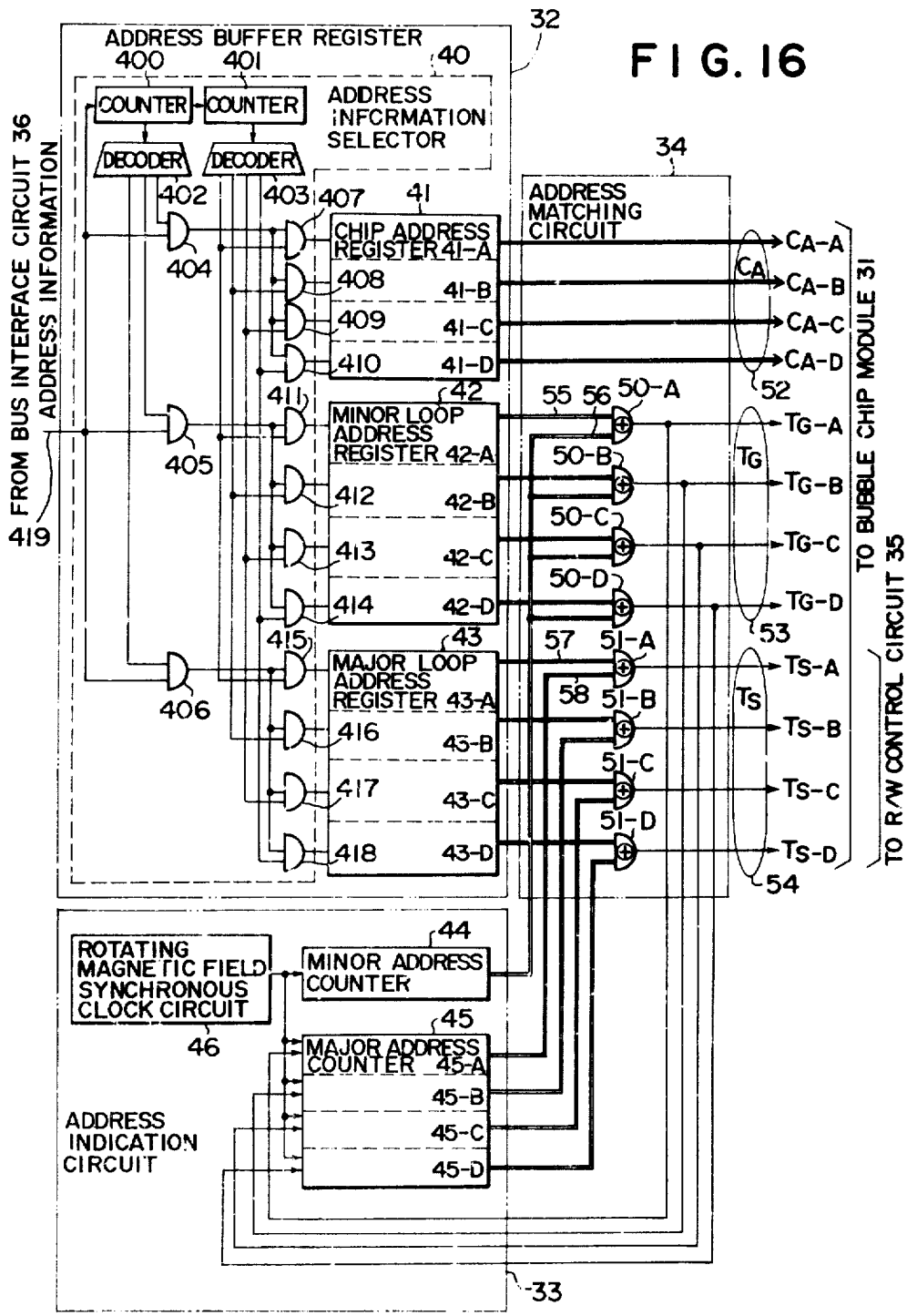
FIG. 16 is a block diagram showing in detail an address buffer register, an address indication circuit and an address matching circuit according to the invention.

FIG. 16 shows in detail arrangements of the address buffer 32, the address indication circuit 33 and the address matching circuit 34. Reference numeral 40 denotes an address information selector which serves to decompose the address information 419 from the bus interface 36 into the chip address, minor loop address and the major loop address and selectively distribute these addresses to the associated registers. An address bit distributing counter 400 serves to control the gating of AND-gates 404, 405 and 406 through a decoder 402 thereby to distribute the chip address, the minor loop address and the major loop address to the respective registers as provided separately for each address. An address identification counter 401, here, serves to control the gating of AND gates 407 to 418 through a decoder thereby to cause four address information 419 as received in response to the four access requests to be stored in the associated registers in a predetermined sequential order.

A chip address register array 41 is composed of four registers 41-A, 41-B, 41-C and 41-D on the assumption that the four access requests are processed as in the case of the illustrated system. These registers correspond to the individual chips in the arrangements shown in FIGS. 10 and 12 and to the subgroup of the chip segments in the arrangement shown in FIG. 13. The respective registers 41-A to 41-D are capable of separately storing the same number of chip addresses as that of chips simultaneously subjected to the writing or reading operation. In a similar manner, each of minor loop address register array 42 and major loop address register array 43 is composed of four registers 42-A, . . . , 42-D and 43-A, . . . , 43-D, respectively.

A minor address counter 44 is provided to give an accurate indication of rotating position of the minor loop in the bubble chip module. To this end, the counter 44 is supplied with a clock signal from a rotating magnetic field synchronous clock circuit 46. Further, four major address counters 45-A, 45-B, 45-C and 45-D are provided in correspondence with the four access requests and adapted to indicate the rotating positions of the bubble bit in each of the major loops of the bubble chips corresponding to the four access requests after the bits having been transferred from the respective minor loops. These counters 45 are also supplied with the clock signal at the count inputs thereof from the rotating magnetic field synchronous clock generator 46. The counting operations of these counters 45 are started, when the associated bit information is transferred to the major loop from the minor loops, i.e. when the gating signal $T_G$ 53 is validated.

Minor address matcher (MAT) circuit 50-A, . . . , 50-D are provided for verifying the matching between the minor address registers 42-A, . . . 42-D and the minor address counter 44. When the matching is found, the gating signal $T_G$53 is supplied to the bubble chip module 31 to allow the information to be transferred from the minor loop to be major loop and at the same time a count start command is applied to the associated major address counter 45-A, . . . , 45-D. Each of two input signal 55 and 56 to the single minor address matcher (50-A, for example) is usually constituted by a plurality of bits. Accordingly, only when coincidence is found between the two input signals in respect of all bits, the minor address matcher (50-A) can produce the output.

Major address matchers 51-A, . . . , 51-D are also provided in correspondence with the four access requests for verfiying the matching between the major address registers 43-A, . . . , 43-D and the major address counter 45-A, . . . , 45-D. When the matching is found, the corresponding matcher validates the data transfer command $T_S54$ to be sent to the bubble chip module 31 and the read/write control circut 35, whereby the data transfer as well as the read-out or write-in operation is initiated. Since each of two input signals 57 and 58 to the single matcher (51-A, for example) consists usually of a plural bits, the matcher can validate the data transfer command $T_{S-A}$ at the output thereof only when the coincidence is found between these two input signals in respect of all the bits.

Reference numeral 52 denotes chip address signals including the outputs CA-A, ..., CA-D from the chip address register 41-A, ..., 41-D. Each of the chip addresses CA-A, ..., CA-D is usually constituted by a plurality of bits. In the case of the arrangement shown in FIG. 13, each of the chip addresses CA-A, ..., CA-D consists of two bits, because four chip subgroups are provided, each chip subgroup in turn being composed of four chip segments No. 0, ..., No. 3. The chip addresses CA 52 are sent to the bubble chip module 31 to designate the chip for each of the access requests.

In the foregoing, an exemplary arrangement of the magnetic bubble memory equipment according to the invention has been described on the assumption that the number of access requests which can be received and processed in one lot is four at maximum and that the bubble chip module 31 includes correspondingly four bubble chips or chip subgroups. However, it will be appreciated that the number of the access requests may be increased or decreased and the bubble chip module 31 may include an increased number of the bubble chips or chip subgroups with the number of chip segments in each of the chip subgroups being correspondingly increased with similar arrangements. Further, although the minor address matchers 50-A, ..., 50-D and the major address matchers 51-A, ..., 50-D are assumed to be separately provided, it is possible to integrate both matchers in one unit. Additionally, it will readily occur to those skilled in the art that a single matcher circuit is operated on a time-division base to the same effect.

The transit of information bits to the minor loops from the major loop, i.e. the re-storage of information can be processed after elapse of time required for the information to perform a single rotation in the major loop from the transit time, i.e. after elapse of a predetermined time independently from the processing of the access requests. Since such re-storage operation is rather irrelevant to the essence of the invention, description thereof as well as illustration of instrumentation are omitted. It should be mentioned however that the arrangement for executing the re-storage operation can be easily deduced from the foregoing description.

Figure 7:
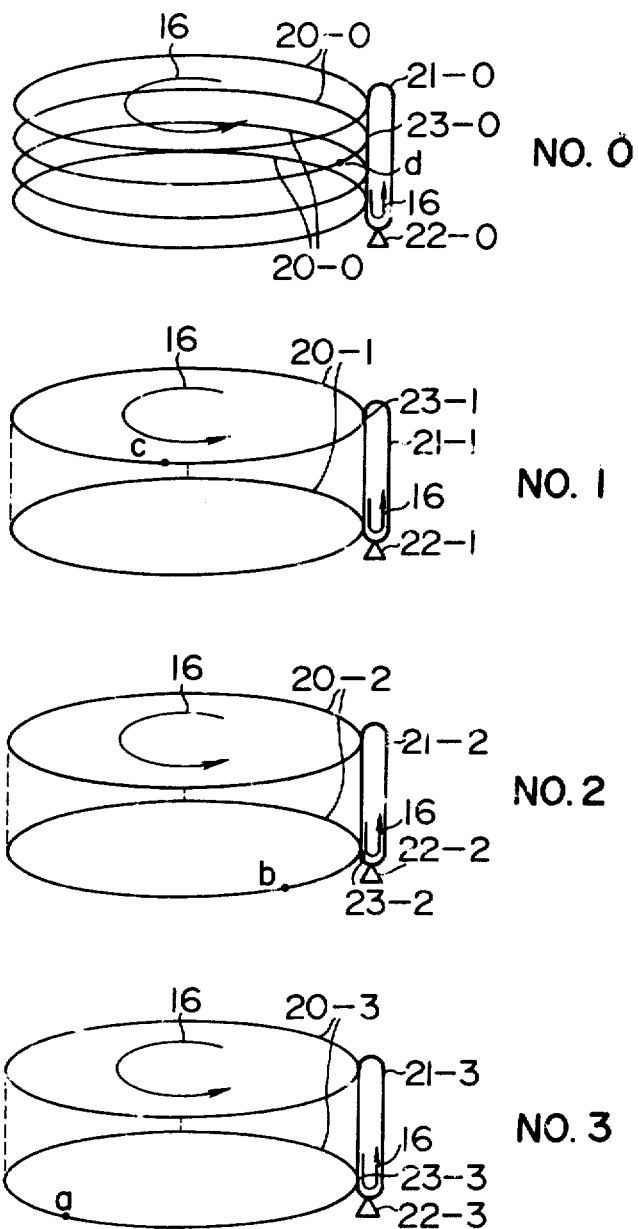
FIG. 7 shows schematically an arrangement of a magnetic bubble memory device.
Figure 8:
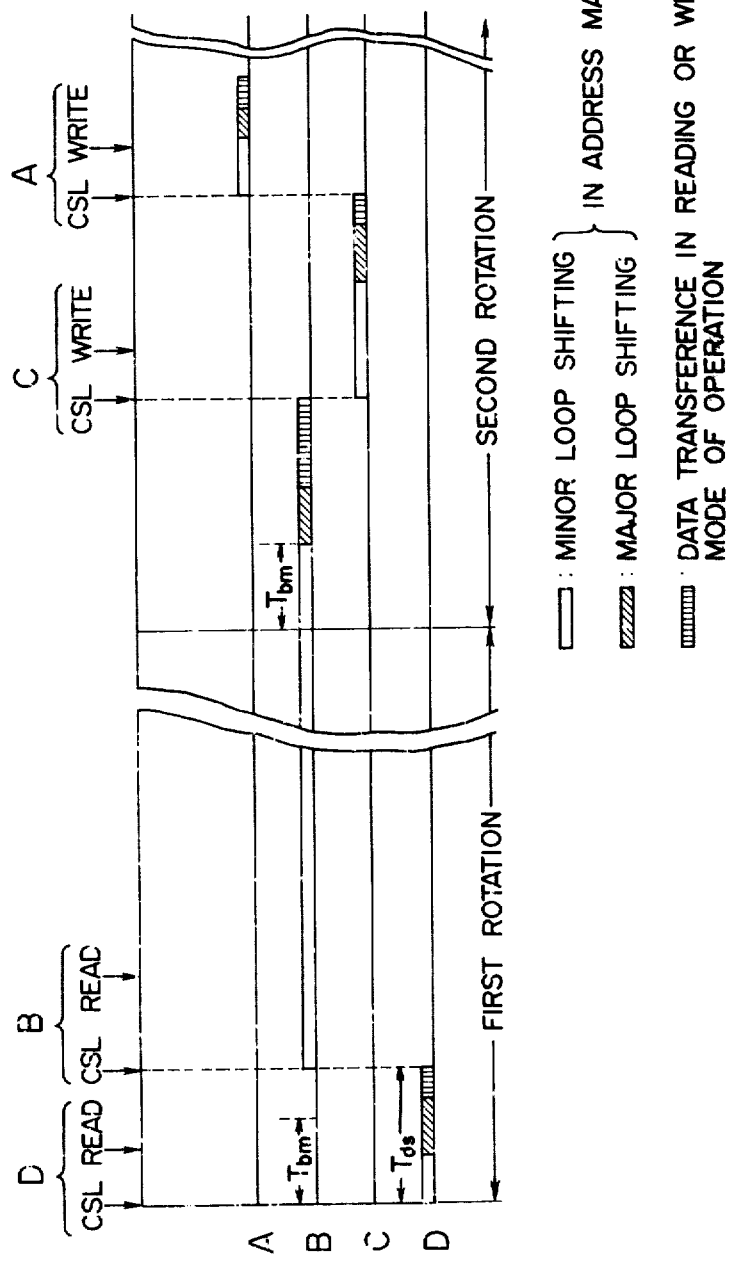
FIG. 8 is a timing chart for illustrating executions of access requests in a hitherto known magnetic bubble memory device.

Next, description will be made on the operation of the magnetic bubble memory equipment according to the invention by referring to the exemplary case in which four access requests A, B, C and D to the memory locations a, b, c and d shown in FIG. 7 are to be processed.

Figures 17, 18:
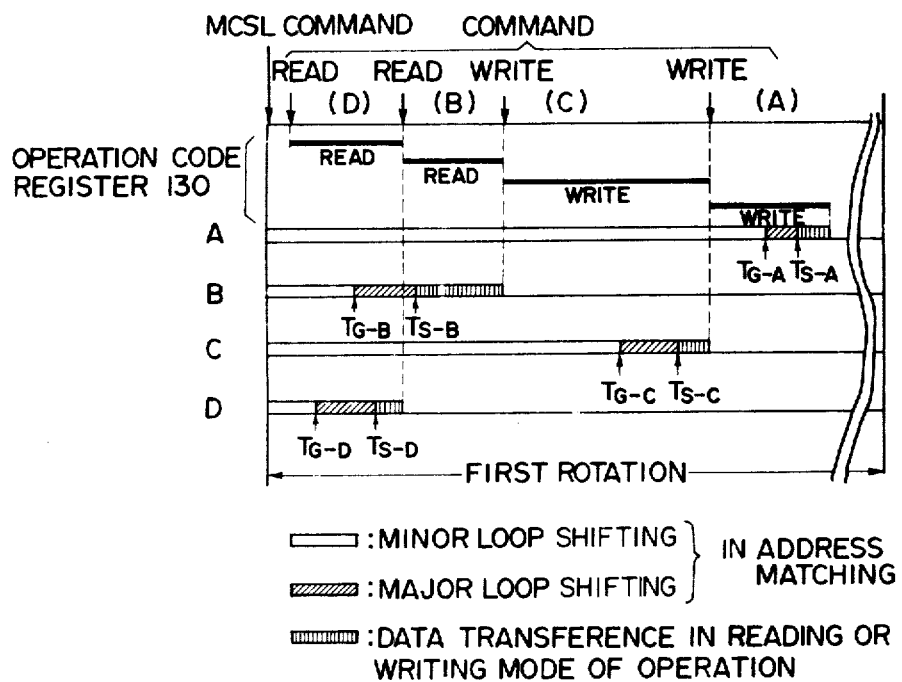
FIG. 17 shows a format of commands for a plurality of access requests to a magnetic bubble memory.
FIG. 18 is a timing chart illustrating execution of access requests in the invention.

At first, the central processor unit will prepare a group of command in such a format as shown in FIG. 17, in which MCSL (Multiple Control Search Location) command is a control command for sending out the magnetic bubble memory addresses for the four succeeding access requests to the magnetic bubble memory equipment. When the start input/output (I/O) instruction is executed by the central processor unit, the data channel equipment sends out the addresses corresponding to the access requests A, B, C and D in response to the MCSL command. In the magnetic bubble memory equipment, the plural addresses are sequentially fetched into the associated registers of the address buffer register unit 32 through the bus interface 36. For the access request A, the chip address is stored in the chip address register 41-A, the minor loop address is stored in the minor address register 42-A and the major address is stored in the major address register 43-A. For the access request B, the chip address is stored in the chip address register 41-B, while the minor loop address and the major loop address are stored in the registers 42-B and 43-B, respectively. In a similar manner, addresses for the access requests C and D are stored in the respective registers.

Subsequently, the address matching operation is initiated. The matching between the minor address registers 42-A, ..., 42-D and the minor address counter 44 is verified by the address matchers 50-A, ..., 50-D of the address matching circuit 34. In the present exemplary case, the matching is detected at first for the minor address for the access request D, as illustrated in FIG. 18. Then, the gate drive signal $T_{G-D}$ at the output of the minor address matcher 50-D is validated and sent to the bubble chip module 31, as a result of which the gate driver circuit $G_{D0}$ is energized for the chip No. 0 as designated by the chip address CA-D thereby to bring about the information transfer from the minor loop to the major loop. The output from the minor address matcher 50-D further commands the initiation of counting operation of the major address counter 45-D and the matching verification for the major loop address.

Subsequently, matching of the minor address for the access request B is detected, whereby the gate drive signal $T_{G-B}$ is validated at the output of the minor address matcher 50-B and transmitted to the magnetic bubble chip module 31. Since the chip No. 2 is designated by the chip address CA-B for the access request B, the gate driving signal $T_{G2}$ is validated in the bubble chip module 31 to energize the gate driver circuit $GD_2$, thereby to allow the information transfer to take place from the minor loop to the major loop in the bubble chip No. 2.

Subsequently, the matching of the major loop address for the access request D is found, as a result of which the data transfer command $T_{S-D}$ at the output of the major address matcher 51-D is validated and sent to the bubble chip module 31 and the read/write control circuit 35. In the bubble chip module 31, the data transfer command $T_{S-D}$ makes appearance at the output $T_{SO}$ of the data transfer signal connection circuit 110 in dependence on the chip address CA-D for the access request D thereby to energize the reading chip selector circuit 103. Consequently, the read data signal from the sensor of the bubble chip No. 0 is inputted to the sense amplifier (SA) 102, resulting in that the read data (R-Data) 106 is sent to the read/write control circuit 35. At the control circuit 35, the READ command 132 has been validated from the data channel equipment so that the control circuit 35 is ready to initiate the transfer of the data signal R-Data 106, whereby, in response to the rise-up edge of the data transfer command, the data signal R-Data 106 is received from the bubble chip module 31 and sent out to the bus interface as the data signal R-Data 140 through the reading buffer register 135. Simultaneously, the R-Data sending command 138 is transmitted to the bus interface 36 which will then send the data read out from the location d designated by the access request D to the data channel equipment, whereupon the processing of the access request D has been completed. The magnetic bubble memory equipment will then receive the operation command (READ-B command in the illustrated case) for the access request to be next executed from the data channel equipment, which command is then stored in the operation command register 130 in preparation for the succeeding transfer operation.

At this time, the matching of the major loop address for the access request B is verified and the data transfer command signal $T_{S-B}$ is validated, which involves processing operation such as described above in conjunction with the access request D thereby to process the access request B. In a similar manner, the access requests C and A are processed sequentially.

It will be now understood that the read-out/write-in operations for the four access requests can be accomplished during a period corresponding to one rotation of the minor and major loops, as is illustrated in FIG. 18.

In the foregoing description, one bit in a bubble chip is assigned to one address. Actually, however, it is usual that an address for an access request consists of plural bits, and the following three ways of bit assignment are considered, taking as an example an address consisting of N bits:

(a) the parallel assigning system in which bits in N chips simultaneously subjected to the reading or writing operation are assigned to the N bits in the address;

(b) the series assigning system in which bits time-sequentially subjected to the reading or writing operation are assigned to the N bits in the address; and (c) the series-parallel assigning system in which N bits in the address are constituted by plural sets of bits (e.g., N = n bits × K sets) and n bits of each set are read or written according to the parallel assigning system and the K sets are read or written according to the series assigning system.

The multi-access system described hereinbefore is well applicable to any one of the above-mentioned address bit assigning systems.

Further in the foregoing description, it has been assumed that all the address bits for the plural access requests are sent out from the data channel equipment in one lot. However, it is possible to sent out parts of the address bits (e.g. for the chip addresses and the minor loop addresses) in one lot, while the other address bits (e.g. major loop addresses) are sent out for every access request as is in the case of the CSL command. Important is that the address matching operations for the plural access requests are performed precedingly and to this end all or part of the address information for the succeeding access requests is precedingly received. Accordingly, the command group prepared and sent out by the central processor unit is never restricted to such format as shown in FIG. 17. For example, four CLS commands corresponding to the four access requests may be successively sent out without time interval and thereafter the READ/WRITE commands may be transmitted sequentially. Alternatively, MCSL command or four CSL commands and four READ/WRITE commands may be sent out at first in one lot, while the transfers of the readout on write-in data are executed sequentially.

As will be appreciated from the foregoing description, a number of address matching operations can be conducted in parallel for the memory device assigned with address such as the magnetic bubble memory equipment according to the teachings of the invention, whereby the access time can be reduced with the processing capability being significantly enhanced.

What we claim is:

1. A magnetic bubble memory equipment adapted to receive address informations for a plurality of access requests each of which informations includes a chip address, a minor loop address and a major loop address and receive operation command informations commanding either read-out or write-in operations corresponding to said access requests from a data channel equipment and to execute sequentially data transfers with said data channel equipment, comprising:

(a) a bubble chip module including a plurality of magnetic bubble memory chips each of which is of a major-minor loop configuration having gates, gate driver circuits for driving said gates of said chip in response to gate drive signal, a gating signal connection circuit adapted to receive said chip address and said gate drive signal and apply the received gate drive signal to the gate driver circuit corresponding to the received chip address thereby to drive the associated gate, and chip selector circuit means for receiving said operation command informations, said chip address and data transfer command signal thereby to perform data read-out operation or data write-in operation for the chip corresponding to said received chip address;

(b) address information storage means for receiving a plurality of address informations for said plurality of access requests in one lot from said data channel equipment to store therein separately the chip addresses, minor loop addresses and the major loop addresses separately for each of said access requests;

(c) matching means including first signal generating means for generating signals indicating rotating positions of the minor loops of said magnetic bubble memory chips, second signal generating means for generating signals indicating rotating positions of the informations in the major loops in each of said chips transferred from the minor loop in each of said chips corresponding to said plurality of access requests, first matching means for fetching sequentially the minor loop addresses for said plurality of access requests from said address information storage means to verify matching to said signals indicating the rotating positions of said minor loops thereby to output the gate drive signals upon verification of said matching, and second matching means for fetching sequentially the major loop addresses for said plurality of access requests from said address information storage means to verify matching to said signals indicating said rotating positions of informations in said major loops thereby to output said data transfer command signal upon verification of said matchings; and (d) means for executing the data transfers between said magnetic bubble chip module and said data channel equipment, said executing means including operation command means for receiving the operation command informations and identifying the contents thereof in respect of data read-out or write-in commands thereby to cause said chip selector circuit means to perform the read-out or write-in operation in dependence on the contents of said operation command information, means for receiving the data transfer command signals from said matching means and sending the read-out data from said chip selector circuit means to said data channel equipment or sending the data to be written from said data channel equipment to said chip selector circuit means in accordance with said command identified by said operation command means, and means for fetching the operation command information from said data channel equipment to be supplied to said operation command means and fetching the address informations to be supplied to said address information storage means.

2. A magnetic bubble memory equipment as set forth in claim 1, wherein said address information storage means comprises;
 (a) First control means for discriminating and fetching the chip addresses, the minor loop addresses and the major loop addresses separately for the access requests from the address informations for said plurality of access requests received sequentially from said data channel equipment,
 (b) second control means for discriminating the access requests and correspondingly fetching the chip addresses, minor loop addresses and the major loop addresses as sequentially fetched by said first control means;
 (c) a plurality of register groups for storing said address informations fetched by said second control means separately for the chip address, the minor loop address and the major loop address for each of said access requests.

3. A magnetic bubble memory equipment as set forth in claim 1, wherein
 (i) said signal generating means for generating the signals indicating the rotating positions of said minor loops comprises;
   (a) a clock circuit for generating clock pulses in synchronism with the rotation of magnetic field for rotating said minor loops and major loops of said magnetic bubble memory chips; and
   (b) minor address counters for counting said clock pulses from said clock circuit thereby to output the signal indicating the rotating positions of said minor loops;
 (ii) said signal generating means for generating the signals indicating the rotating positions of said major loop comprises major address counter groups provided for each of the access requests and adapted to initiate the counting of the clock pulses from said clock circuit in response to the gate drive signals outputted from first matcher circuit group thereby to output the rotating position of said major loop;
 (iii) said first matching means comprises a first matcher circuit group each having one input for receiving the contents of registers for storing the minor loop addresses separately for each of the access requests in said address information storage means and the other input for receiving the output from said minor address counter thereby to perform the matching between said two inputs and produce the gate drive signal upon verification of said matching, and
 (iv) said second matching means comprises a second matcher circuit group each having one input for receiving the contents of registers storing the major loop addresses separately for each of the access requests in said address information storing means and the other input for receiving the output from said major address counter thereby to perform matching between the two inputs and produce the data transfer command signal upon verification of said matching.

4. A magnetic bubble memory equipment as set forth in claim 1, wherein
 (i) said operation command means of said means for executing said data transfer comprises
  (a) a register means for receiving and storing said operation command information, and
  (b) a decoder for fetching and decoding the contents of said register thereby to output read command or write command,
 (ii) said sending means comprises:
  (c) a data sending and receiving control circuit composed of an OR-gate for receiving at inputs thereof the data transfer command signals for each of the access requests from said matching means and AND-gates each having one input for receiving said read command or said write command and other input for receiving the output signal from said OR-gate thereby to output read-out data sending command signal and write-in data receiving command signal;
  (d) a first buffer register for receiving said read command signal and storing the read-out data from said bubble chip module;
  (e) a second buffer register for receiving said write command and storing the data to be written from said data channel equipment;
  (f) a first AND-gate for establishing a path between said first buffer register and said data channel equipment in response to an enabling input signal thereby to allow the read-out data in said first buffer register to be transferred to said data channel equipment,
  (g) a second AND-gate for establishing a path between said data channel equipment and said second buffer register in response to an enabling input thereby to allow the write-in data to be transferred to said second buffer register from said data channel equipment; and
  (h) a control circuit for receiving the read-out data sending command signal or write-in data receiving command signal from said data sending and receiving control circuit thereby to produce said enabling input signal to said first or second AND-gate.

5. A magnetic bubble memory equipment as set forth in claim 1, wherein said chip selecting circuit means of said bubble chip module comprises:
 (a) a data transfer signal connection circuit for receiving said chip addresses and said data transfer commands from said matching means for each of said access requests thereby to output said data transfer command signals;
 (b) means for selecting the chip corresponding to said data transfer command and selecting data read-out or data write-in operation;
 (c) a sense amplifier for reading out memory information from said selected chip through said read-out and write-in selecting means when receiving said read command from said data transfer executing means, thereby to output said memory information as read-out data to said data transfer executing means; and
 (d) a write-in driver for allowing said write-in data from said data transfer executing means to be written in said selected chip through said read-out and write-in selection means when receiving said write command from said data transfer executing means.

6. A magnetic bubble memory equipment as set forth in claim 5, wherein said chip selection circuit means comprises (a) sense amplifiers each provided separately for each of said bubble chips, (b) write-in drivers each provided separately for each of said chips, and (c) a data transfer signal connection circuit for receiving said chip addresses and said data transfer command signal thereby to supply the data transfer command signals to desired ones of said sense amplifiers and said write-in drivers.

7. A magnetic bubble memory equipment as set forth in claim 1, wherein said bubble chip module comprises:
   (a) a plurality of chip subgroups each including a plurality of chips;
   (b) a decoder for receiving the chip address from said matching means to output a signal for selecting the chip of said chip subgroup;
   (c) means provided in correspondence to said chip subgroups and adapted for receiving the chip selection signal thereby to drive the gates of the corresponding chip;
   (d) selecting means provided in correspondence to said chip subgroups and adapted to receive the chip selection signal thereby to select the desired chip for performing the read-out or write-in operation;
   (e) sense means provided in correspondence to said chip subgroups and adapted for receiving said read command and data transfer command signal thereby to perform the data read-out operation from said selected chip through said selecting means;
   (f) write-in means provided in correspondence to said chip subgroups and adapted for receiving said write command and said data transfer command signal thereby to perform the data write-in operation to the selected chip through said selecting means;
   (g) a gating signal connection circuit for receiving the chip address and the gate drive signal from said matching means thereby to supply the gate enabling signal to said means for driving said gates; and
   (h) a data transfer command signal connection circuit for receiving the chip address and the data transfer command signal from said matching means thereby to supply the data transfer command signal to the means for selecting the desired chip for performing the data read-out or write-in operation thereto.

8. A magnetic bubble memory equipment as set forth in claim 5, 6 or 7, wherein:
   said gating signal connection circuit comprises
      (a) circuit groups including decoders provided separately for each of the access requests for receiving the chip addresses separately for each of said access requests thereby to output signals identifying the desired chips, and AND-gate group for receiving at inputs said output signal from said decoders and the gate drive signals received from said matching means separately for each of said access requests thereby to output the gating signals to the desired chip, and
      (b) OR-gate group receiving at the inputs the output signals from said circuit groups destined for the identical chip thereby to send out the gating signals separately for each of said chips; and
   said data transfer command signal connection circuit comprises (a) circuit groups including decoders provided separately for each of the access requests for receiving the chip addresses separately for each of said access requests thereby to output signals identifying the desired chips, and AND-gate group for receiving at inputs said output signal from said decoders and the data transfer command signals received from said matching means separately for each of said access requests thereby to output the data transfer command signals to the desired chip, and (b) OR-gate group receiving at the inputs the output signals from said circuit groups destined for the identical chip thereby to send out the data transfer command signal separately for each of said chips.

* * * * *

UNITED STATES PATENT AND TRADEMARK OFFICE
CERTIFICATE OF CORRECTION

PATENT NO. : 4,183,090

DATED : January 8, 1980

INVENTOR(S) : Kazuo FURUKAWA; Takeshi MASUDA; Masakatu NUNOTANI and Nokio AMANO

It is certified that error appears in the above-identified patent and that said Letters Patent are hereby corrected as shown below:

Assignees: Nippon Telegraph and Telephone Public Corporation and Hitachi, Ltd.

Signed and Sealed this

Nineteenth Day of August 1980

[SEAL]

*Attest:*

SIDNEY A. DIAMOND

*Attesting Officer*  *Commissioner of Patents and Trademarks*